United States Patent
Kamakura

(10) Patent No.: US 11,490,547 B2
(45) Date of Patent: Nov. 1, 2022

(54) WEARABLE DISPLAY DEVICE

(71) Applicant: SEIKO EPSON CORPORATION, Tokyo (JP)

(72) Inventor: Kazuya Kamakura, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 204 days.

(21) Appl. No.: 17/005,552

(22) Filed: Aug. 28, 2020

(65) Prior Publication Data
US 2021/0068316 A1    Mar. 4, 2021

(30) Foreign Application Priority Data
Aug. 29, 2019 (JP) .............................. JP2019-156440

(51) Int. Cl.
*H05K 7/20* (2006.01)
*G02B 27/01* (2006.01)

(52) U.S. Cl.
CPC ..... *H05K 7/20963* (2013.01); *G02B 27/0176* (2013.01); *G02B 2027/0178* (2013.01)

(58) Field of Classification Search
CPC combination set(s) only.
See application file for complete search history.

(56) References Cited

U.S. PATENT DOCUMENTS

| 2016/0041395 | A1  | 2/2016  | Yajima  |          |
|--------------|-----|---------|---------|----------|
| 2016/0179148 | A1* | 6/2016  | Takagi  | G06F 1/163 345/8 |
| 2018/0275497 | A1  | 9/2018  | Kase    |          |
| 2019/0332142 | A1* | 10/2019 | Satou   | G06F 1/1639 |
| 2021/0080732 | A1* | 3/2021  | Hoover  | G06F 1/203 |

FOREIGN PATENT DOCUMENTS

| CN | 105372814 A  | 3/2016  |
| CN | 108628072 A  | 10/2018 |
| JP | 2007-174526 A | 7/2007  |

* cited by examiner

*Primary Examiner* — Sahlu Okebato
(74) *Attorney, Agent, or Firm* — Oliff PLC

(57) ABSTRACT

A wearable display device includes a display element, a circuit board, an outer case including a first case member and a second case member, the first case member being configured to dissipate heat generated by the circuit board to outside, the second case member being disposed farther to a wearer side than the first case member is and configured to dissipate heat generated by the display element to the outside, and a heat insulating structure disposed in a region where the first case member and the second case member face each other.

12 Claims, 12 Drawing Sheets

WEARABLE DISPLAY DEVICE

The present application is based on, and claims priority from JP Application Serial Number 2019-156440, filed Aug. 29, 2019, the disclosure of which is hereby incorporated by reference herein in its entirety.

BACKGROUND

1. Technical Field

The present disclosure relates to a wearable display device for providing a virtual image to an observer.

2. Related Art

A wearable display device that has an eyewear-like appearance and includes a display panel or the like incorporated in an outer member positioned on the side of the wearer's head is known.

A portable electronic device such as a video camera that includes, in an outer case, a first type of heat generating electronic component that is a CCD unit, and a second type of heat generating electronic component that is an integrated circuit is known although it is not a wearable display device (JP-A-2007-174526). In this portable electronic device, a first heat dissipation plate connected to the first type of heat generating electronic component and a second heat dissipation plate connected to the second type of heat generating electronic component are disposed close to each other, and an insulating member that blocks heat radiation is disposed between the heat dissipation plates. Further, the second heat dissipation plate is connected to a third heat dissipation plate that extends along a portion of the inner surface of the outer case.

With the device of JP-A-2007-174526, the outer case has to be large in order to house multiple types of heat generating electronic components and a plurality of heat dissipation plates for heat dissipation of the heat generating electronic components. However, a wearable display device such as a head-mounted display that is worn on the user's face needs to be small and lightweight as is evident from the way it is used, and it is therefore difficult to apply the heat dissipation structure such as that of the device disclosed in JP-A-2007-174526 to a wearable display device.

SUMMARY

A wearable display device according to one aspect of the present disclosure includes a display element, a circuit board, an outer case including a first case member and a second case member, the first case member being configured to dissipate heat generated by the circuit board to outside, the second case member being disposed farther to a wearer side than the first case member is and configured to dissipate heat generated by the display element to the outside, and a heat insulating structure disposed between the first case member and the second case member.

DESCRIPTION OF EXEMPLARY EMBODIMENTS

First Embodiment

A first embodiment of a wearable display device according to the disclosure is described below with reference to the accompanying drawings.

Figure 1:
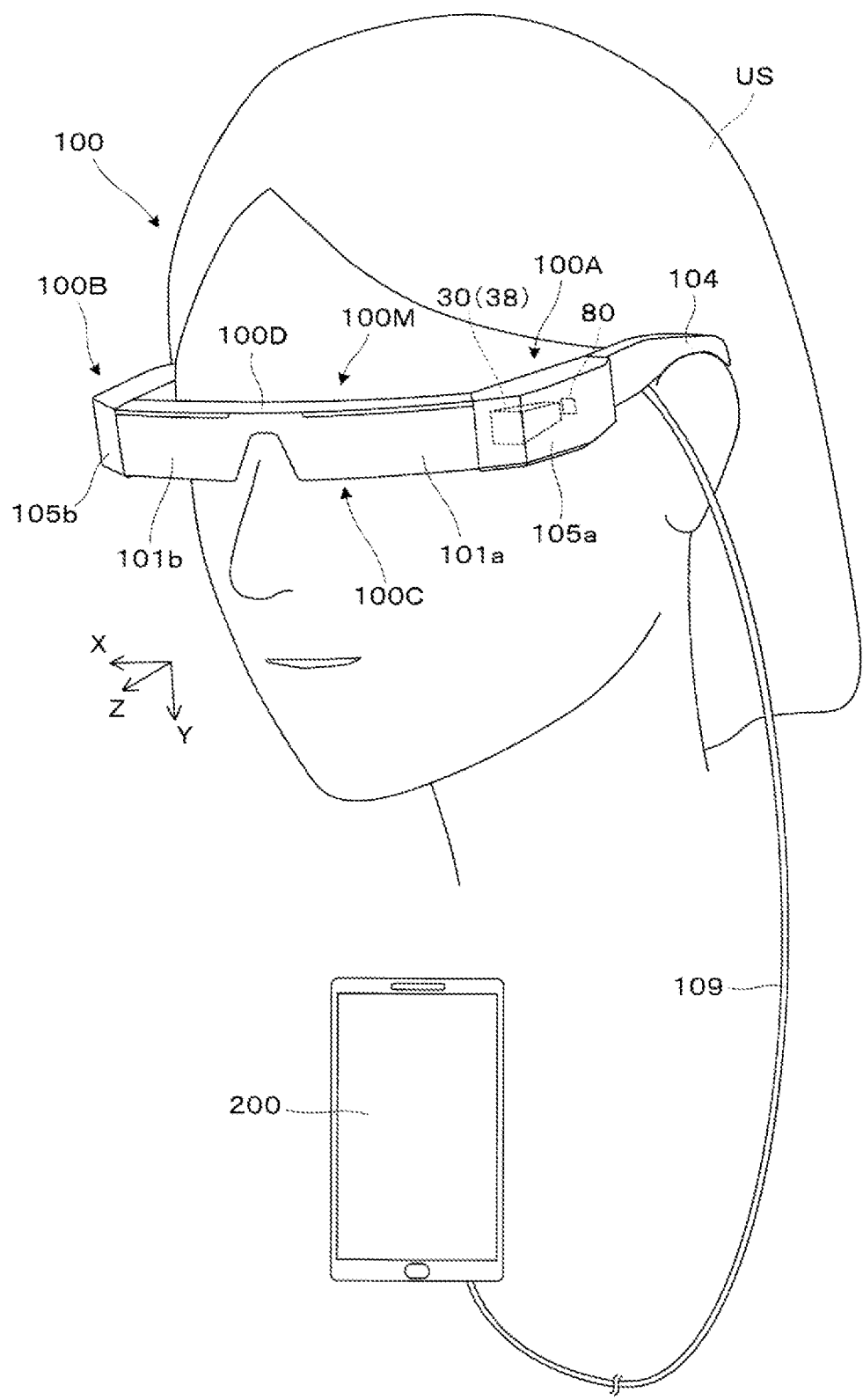
FIG. 1 is a perspective view illustrating a use state of a wearable display device of a first embodiment.

As illustrated in FIG. 1, a wearable display device 100 of the embodiment is a head-mounted display (HMD) having an eyeglass-like appearance. In FIG. 1, X, Y, and Z are orthogonal coordinate systems. The +X direction corresponds to a lateral direction in which both eyes of an observer wearing the wearable display device 100 line up, the +Y direction corresponds to an downward direction orthogonal to the lateral direction in which both eyes of the observer line up, and the +Z direction corresponds to a forward direction or a front direction of the observer.

The wearable display device 100 can allow an observer or a wearer US wearing the wearable display device 100 not only to visually recognize a virtual image but also to observe the outside world image in a see-through manner. The wearable display device 100 may be communicatively connected to an external device 200 such as a smartphone through a cable 109, and can form a virtual image corresponding to a picture signal input from the external device 200, for example. The wearable display device 100 includes a first display device 100A and a second display device 100B. The first display device 100A and the second display device 100B are parts that form a virtual image for the left eye and a virtual image for the right eye, respectively. The first display device 100A for the left eye includes a first virtual image forming optical part 101a that covers the front side of the eye of the observer in a visually transparent manner, and a first image forming body part 105a that forms image light. The second display device 100B for the right eye includes a second virtual image forming optical part 101b that covers the front side of the eye of the observer in a visually transparent manner, and a second image forming body part 105b that forms image light.

Temples 104, which are earpieces extending rearward from the side surface of the head, are pivotably attached to rear portions of the first and second image forming body parts 105a and 105b through hinges (not illustrated). The temples 104 maintain the wearing state of the wearable display device 100 by making contact with the ears, the temples or the like of the observer. Although not illustrated in the drawings, a nose pad that constitutes a support part together with the temples 104 is provided in a recess formed between the first and second virtual image forming optical parts 101a and 101b, and the nose pad enables positioning of the virtual image forming optical parts 101a and 101b and the like with respect to the eyes of the observer.

Figure 2:
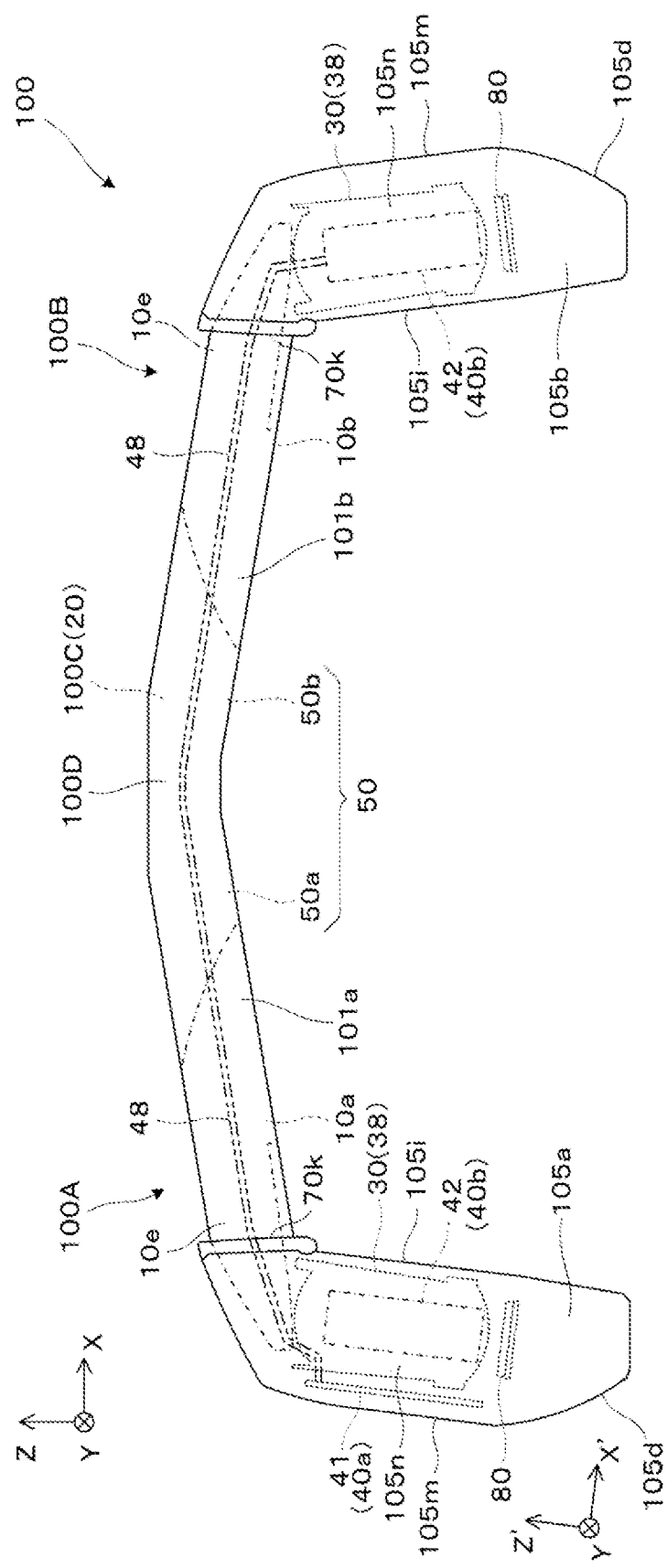
FIG. 2 is a plan view illustrating a main part of the wearable display device.

An internal structure and the like of the wearable display device 100 are described with reference to FIG. 2. The first image forming body part 105a includes a display element 80, a projection lens 30, electronic circuit boards 41 and 42, and the like in an outer case 105d having a cover shape. By collectively housing the display element 80, the projection lens 30, the electronic circuit boards 41 and 42, and the like of small sizes in the outer case 105d, it is possible to make the wearable display device 100 multifunctional while making its appearance small and stylish. The outer case 105d of the first image forming body part 105a may be referred to as a first outer case 105d for the sake of distinction. The projection lens 30, the display element 80, and the electronic circuit boards 41 and 42 are supported in the first outer case 105d made of metal, and in particular, the display element 80 and the projection lens 30 are fixed in a state where they are aligned with the tip end portion of the virtual image forming optical part 101a. The second image forming body part 105b includes the display element 80, the projection lens 30, the electronic circuit board 42, and the like in the outer case 105d having a cover shape. The outer case 105d of the second image forming body part 105b may be referred to as a second outer case 105d for the sake of distinction. The projection lens 30, the display element 80, and the electronic circuit board 42 are supported in the second outer case 105d made of metal, and in particular, the display element 80 and the projection lens 30 are fixed in a state where they are aligned with the tip end portion of the second virtual image forming optical part 101b.

In the first image forming body part 105a for the left eye, the projection lens 30 is disposed in an earlier stage of the optical path with respect to the first virtual image forming optical part 101a and constitutes a part of the imaging system. The projection lens 30 is disposed on the front side, i.e., the +Z side, in the first outer case 105d. The projection lens 30 is fixed to a lower portion of the outer case 105d, i.e., a bottom surface member 72a described later. The display element 80 is a display device that forms an image corresponding to a virtual image for the left eye. The display element 80 is adjacently disposed on the back side, i.e., the −Z side, of the projection lens 30 in the outer case 105d. The electronic circuit board 41 is a circuit board in which a first circuit 40a, which is a signal processing circuit that does not entail light emission, is formed on the board (see FIG. 3). Specifically, the electronic circuit board 41 is a signal processing board that processes a signal including image data and other information output from the external device 200. The electronic circuit board 41 is a circuit board that is directly connected to an external part, and is disposed on an outer side (−X side), which is the side opposite to the wearer, relative to the electronic circuit board 42 in the outer case 105d. In addition, the electronic circuit board 41 is disposed on the lower side (+Y side) relative to the electronic circuit board 42 in the outer case 105d. Specifically, the electronic circuit board 41 is disposed outside the projection lens 30 and the display element 80 and at a position close to an outer surface 105m of the outer case 105d. The electronic circuit board 42 is a circuit board in which the first circuit 40a, which is a signal processing circuit that does not entail light emission, is formed on the board (see FIG. 3). Specifically, the electronic circuit board 42 is a drive circuit board that drives the display element 80 in the first image forming body part 105a, and operates in accordance with a signal output from the electronic circuit board 41. The electronic circuit board 42 is a circuit board associated with the display element 80, and is disposed in the outer case 105d on the upper side of the projection lens 30 and at a position close to an upper surface 105n of the outer case 105d.

In the second image forming body part 105b for the right eye, the projection lens 30 is disposed in an earlier stage of the optical path with respect to the second virtual image forming optical part 101b and constitutes a part of the imaging system. The projection lens 30 is disposed on the front side, i.e., the +Z side in the second outer case 105d. The projection lens 30 is fixed to a lower portion of the outer case 105d, i.e., a bottom surface member 72a described later. The display element 80 is a display device that forms an image corresponding to a virtual image for the right eye. The display element 80 is adjacently disposed on the back side, i.e., the −Z side, of the projection lens 30 in the outer case 105d. The second image forming body part 105b does not include a member corresponding to the electronic circuit board 41 provided in the first image forming body part 105a. The electronic circuit board 42 is a drive circuit board that drives the display element 80 in the second image forming body part 105b. The electronic circuit board 42 operates in accordance with a signal output from the electronic circuit board 41 provided in the first image forming body part 105a. As with the electronic circuit board 42 provided in the first image forming body part 105a, the electronic circuit board 42 of the second image forming body part 105b is disposed on the upper side of a lens barrel 38 and at a position close to the upper surface 105n of the outer case 105d.

The first and second virtual image forming optical parts 101a and 101b are not separate members, but are coupled at the center so as to form a transparent light guiding unit 100C, which is an integral member. The transparent light guiding unit 100C includes a pair of light guiding members 10a and 10b and a central member 50. The pair of light guiding members 10a and 10b are a pair of optical members that contribute to image formation while propagating image light therein. In other words, the light guiding members 10a and 10b guide, toward the eyes of the wearer US, light emitted from the display element 80. The central member 50 includes a pair of light transmission parts 50a and 50b. The light transmission part 50a is joined to the light guiding member 10a, and the light transmission part 50b is joined to the light guiding member 10b. The transparent light guiding unit 100C is a composite light guiding device 20 that provides a picture for both eyes to the observer or the wearer US by means of light guidance, and is supported by the outer case 105d at both end portions, i.e., on an end portion 10e side of the light guiding members 10a and 10b.

An upper cover 100D is fixed to the top surface of the transparent light guiding unit 100C. A thin and narrow space is formed between the upper cover 100D and the transparent light guiding unit 100C, and a signal line 48 that electrically couples the first image forming body part 105a and the second image forming body part 105b extends therein.

Figure 3:
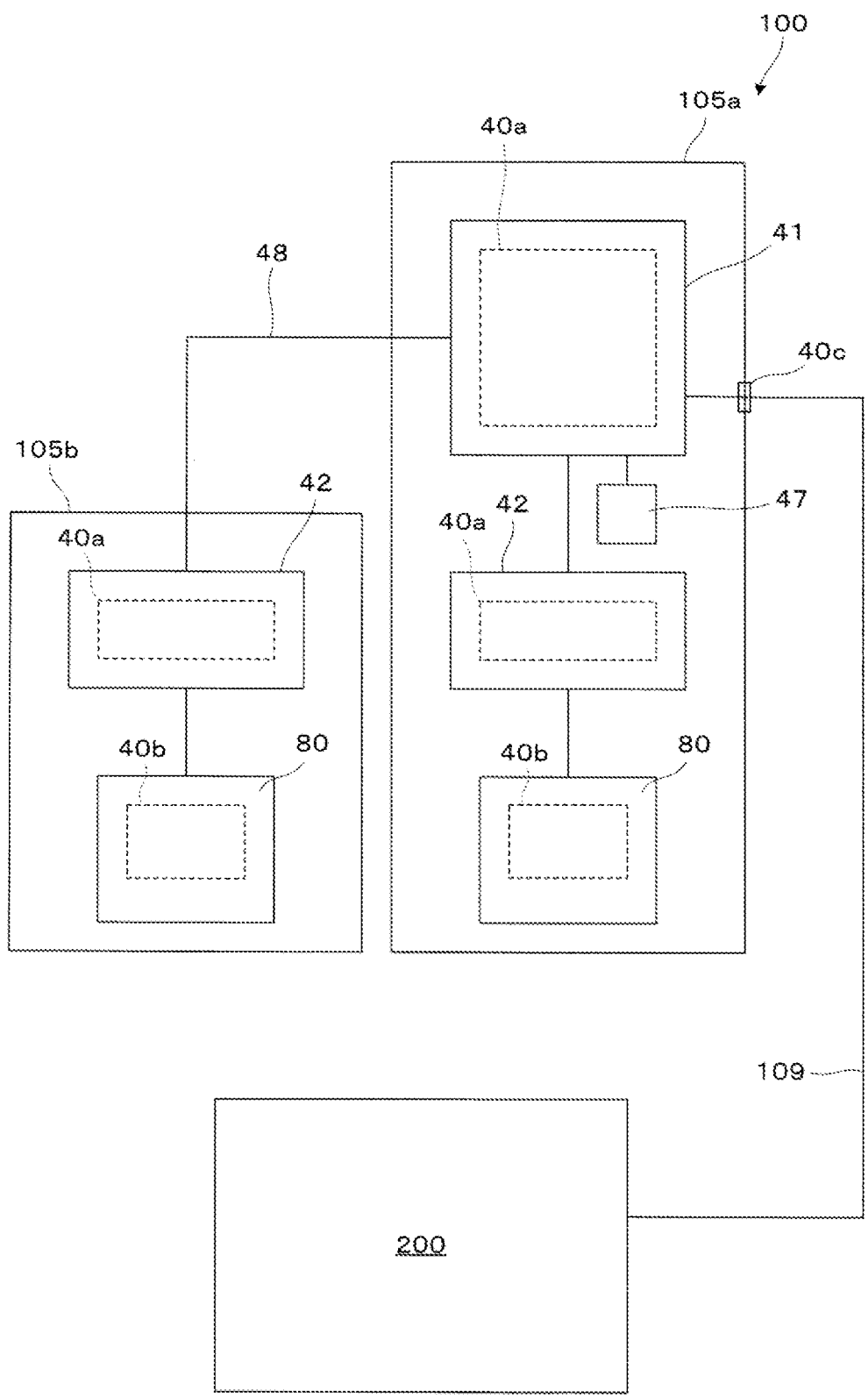
FIG. 3 is a schematic block diagram illustrating a circuit configuration of the wearable display device.

An electronic circuit constituting the wearable display device 100 is described with reference to FIG. 3. The electronic circuit is classified into a circuit incorporated in the second image forming body part 105b for the right eye and a circuit incorporated in the first image forming body part 105a for the left eye illustrated in FIG. 2. The circuit incorporated in the first image forming body part 105a includes two electronic circuit boards, 41 and 42, and the circuit incorporated in the second image forming body part 105b includes one electronic circuit board, 42. In the above configuration, the electronic circuit boards 41 and 42 are boards in which a wiring is formed on or in the surface of an insulating resin board, and have a structure in which an IC and/or an electronic element is mounted to the surface thereof. The electronic circuit boards 41 and 42 are heating elements including the first circuit 40a, and generate heat along with the operation of the wearable display device 100.

The electronic circuit board 41 incorporated in the first image forming body part 105a is connected to the external device 200 through a connector 40c and the cable 109. The electronic circuit board 41 branches a signal received from the external device 200 so as to divide the signal to the electronic circuit board 42 of the first image forming body part 105a and the electronic circuit board 42 of the second image forming body part 105b. In this case, a circuit outside the wearable display device 100, such as the external device 200, plays a role of governing the entire operation of the wearable display device 100, and the electronic circuit board 41 operates under control of the circuit outside the wearable display device 100. The electronic circuit board 41 transfers an output of a sensor 47 to the circuit outside the wearable display device 100 (e.g., the external device 200). The sensor 47 includes, but not limited to, at least one of a temperature sensor, an external light sensor, and an acceleration sensor.

The electronic circuit board 42 incorporated in the first image forming body part 105a operates in response to a display signal output from the electronic circuit board 41, as a drive circuit board that drives the display element 80. Although detailed description is omitted, each electronic circuit board 42 includes, for example, an IF circuit, a scanning drive circuit, a signal drive circuit, and the like, and receives image data or an image signal output from the electronic circuit board 41 to cause the display element 80 to perform two-dimensional image display. The electronic circuit board 42 outputs a drive signal corresponding to the image to the display element 80.

The display element 80 incorporated in the first image forming body part 105a is a self-luminous display device that enables two-dimensional display and operates in a dot-matrix manner. Specifically, each display element 80 is assumed to be an organic electro-luminescence (EL) display panel, but the display panel is not limited thereto, and may be a panel for a liquid crystal display (LCD). In the case where a panel for an LCD is used, a compatible illumination source is required. On a square display surface, the display element 80 can form a color image and can display a two-dimensional video or still image when driven by the electronic circuit board 42.

Figure 4:
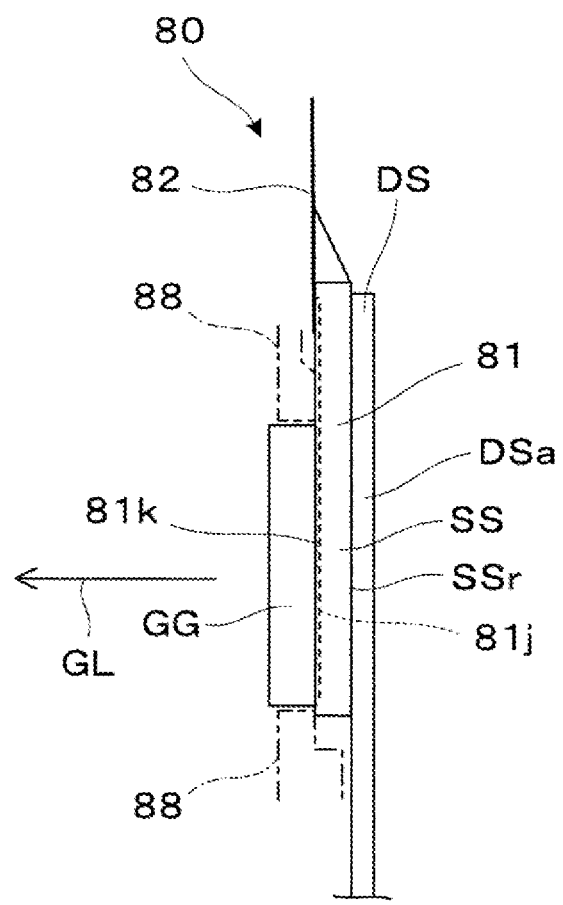
FIG. 4 is a side cross-sectional view schematically illustrating a structure of a display element.

Referring to FIG. 4, the display element 80 includes a rectangular plate-shaped body portion 81 and a flexible printed circuit (FPC) part 82 connected to and extending from the body portion 81. Among them, the body portion 81 includes a silicon board SS in which a drive circuit 81j is formed and forms an outer shape of the body portion 81, a light emitting layer 81k that is an organic LED element including an organic LED material and generates color light to be used as image light, and a sealing protective glass GG that cooperates with the silicon board SS to seal the light emitting layer 81k. The display element 80 emits image light GL toward the protective glass GG side by performing a light emitting operation in accordance with a drive signal received from the FPC part 82. The drive circuit 81j and the light emitting layer 81k of the display element 80 are heating elements corresponding to a second circuit 40b illustrated in FIG. 3, and generate heat along with the emission of the image light GL.

The body portion 81 of the display element 80 is held by a rectangular frame-shaped case part 88. The case part 88 is a member for aligning and fixing the display element 80 to the lens barrel 38 of the projection lens 30. For the purpose of promoting heat dissipation of the display element 80, a first end DSa of the heat dissipation sheet DS, which is a heat dissipation member, is directly bonded to a back surface SSr of the silicon board SS. As illustrated in a region AR1 in FIG. 6, which will be described in detail later, a second end DSb of the heat dissipation sheet DS extends to the outside of the outer case 105d through an opening OP provided in the bottom surface member 72a, which is the lower portion of the outer case 105d, and is bonded to the lower portion of the outer case 105d (i.e., a lower surface 105o of the bottom surface member 72a). In the case where the display element 80 is applied to an HMD to form a high luminance image, the display element itself becomes a heat source, and the temperature rise tends to cause a problem. In particular, in the case where an organic EL display panel is used as the display element 80 as in the embodiment, performance degradation and shortening of life due to temperature rise may be significant as its characteristic. In the embodiment, the back surface SSr of the display element 80 and the lower surface 105o of the outer case 105d are directly coupled by the heat dissipation sheet DS. Thus, efficient heat dissipation of the display element 80 can be achieved, and the operating life can be increased by reliably maintaining the performance of the display element 80.

Returning to FIG. 3, the electronic circuit board 42 incorporated in the second image forming body part 105b has the same structure as the electronic circuit board 42 incorporated in the first image forming body part 105a, and operates in response to a display signal output from the electronic circuit board 41, as a drive circuit board that drives the display element 80 provided in the second image forming body part 105b. The display element 80 incorporated in the second image forming body part 105b has the same structure as the display element 80 incorporated in the first image forming body part 105a, and the display element 80 is cooled by the heat dissipation sheet DS. The electronic circuit board 41 is not incorporated in the second image forming body part 105b.

Figure 5:
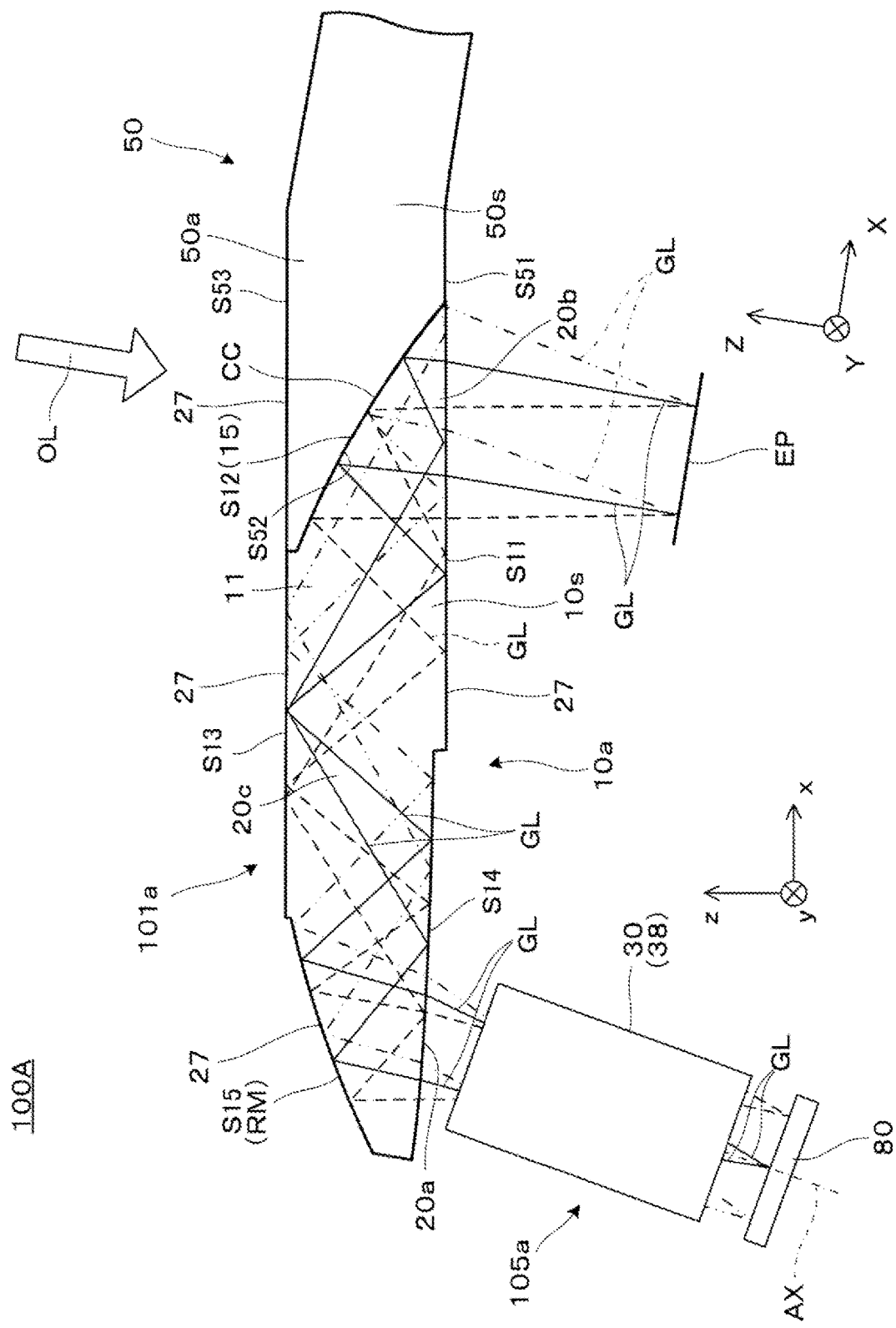
FIG. 5 is a plan view illustrating an optical structure of a first virtual image forming optical part.

FIG. 5 is a diagram illustrating a portion of the first display device 100A and specifically describes an optical structure of the virtual image forming optical part 101a. While the wearable display device 100 is composed of the first display device 100A and the second display device 100B as described above (see FIG. 1), the first display device 100A and the second display device 100B have equivalent structures that are symmetric in the left-right direction, and therefore only the first display device 100A is described and the description of the second display device 100B is omitted. Note that in FIG. 5, x, y, and z are orthogonal coordinate systems, the x-direction and the y-direction are parallel to a first surface S11 and a third surface S13, and the z-direction is perpendicular to the first surface S11 and third surface S13.

The light guiding member 10a of the first virtual image forming optical part 101a is joined to the light transmission part 50a through an adhesive layer CC. The light guiding member 10a and the light transmission part 50a have a structure in which the surfaces of body members 10s and 50s are covered with a hard coat layer 27. The body member 10s of the light guiding member 10a is formed of a resin material with high light transmittance in the visible range, and is molded by injecting thermoplastic resin into a mold and solidifying it, for example. The same applies to the light transmission part 50a or the central member 50, and the body member 50s is formed of the same material as the body member 10s of the light guiding member 10a.

Optical paths of the image light GL are briefly described below. The light guiding member 10a guides the image light GL emitted from the projection lens 30, toward the eye of the observer through reflection at first to fifth surfaces S11 to S15 and the like. Specifically, the image light GL from the projection lens 30 first impinges on the fourth surface S14 formed in a light incidence part 20a so as to be reflected by the fifth surface S15, which is an inner surface of a reflection film RM. Then the image light GL again impinges on the fourth surface S14 from the inner side so as to be totally reflected, and impinges on the third surface S13 so as to be totally reflected, and, impinges on the first surface S11 so as to be totally reflected. The image light GL totally reflected by the first surface S11 impinges on the second surface S12 so as to partially passes through a half mirror 15 provided in the second surface S12 while being partially reflected, and again impinges on and passes through a portion of the first surface S11 formed in a light emission part 20b. The image light GL that has passed through the first surface S11 impinges on a pupil position EP where the eye of the observer is located, as a substantially parallel luminous flux. In other words, the observer or the wearer US observes an image as a virtual image with the image light.

The first virtual image forming optical part 101a allows the observer to visually recognize the image light with the light guiding member 10a, and allows the observer to observe the outside world image with little distortion in the state where the light guiding member 10a and the light transmission part 50a are combined. At this time, since the third surface S13 and the first surface S11 are substantially parallel to each other (with a diopter of approximately 0), the light guiding member 10a causes almost no aberration or the like of outside world light OL. In addition, in the light transmission part 50a, a third transmission surface S53 and a first transmission surface S51 are in planes that are substantially parallel to each other. Further, since the third transmission surface S53 and the first surface S11 are in planes that are substantially parallel to each other, the light transmission part 50a causes almost no aberration or the like. In the above-mentioned manner, the observer can observe an outside world image that has no distortion through the light guiding member 10a and the light transmission part 50a.

Figure 6:
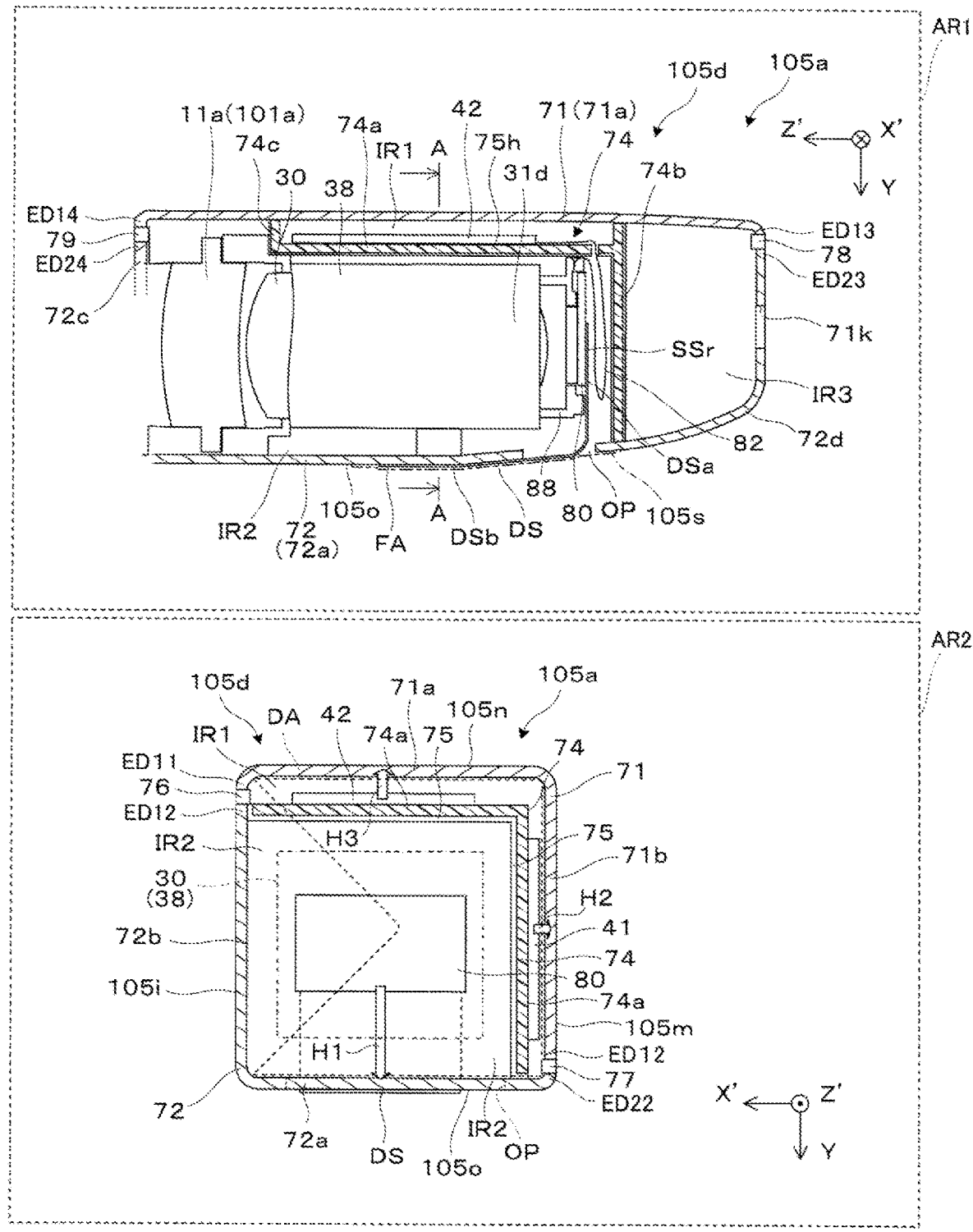
FIG. 6 is a schematic view of a side cross section and a cross section of a first image forming body part.
Figure 7:
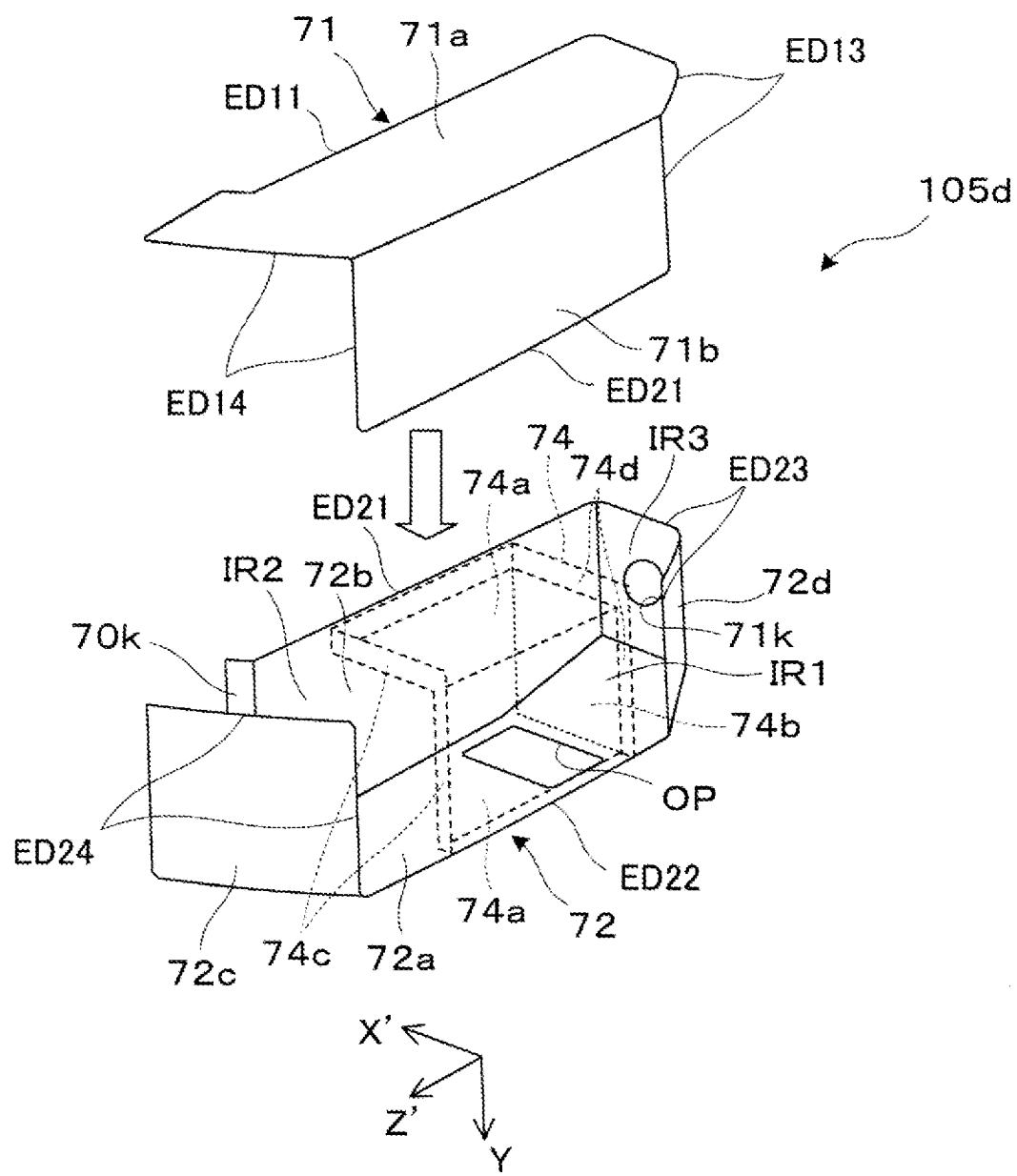
FIG. 7 is a schematic perspective view illustrating a board holder and an outer case of the first image forming body part.

An internal structure of the first image forming body part 105a is described with reference to FIG. 6 and FIG. 7. In FIG. 6, the region AR1 indicates a vertical cross section along the longitudinal direction of the first image forming body part 105a, and the region AR2 indicates a cross section AA of the first image forming body part 105a. FIG. 7 is an exploded perspective view illustrating a structure of the outer case 105d of the first image forming body part 105a and the like. In FIG. 6 and the like, X', Y, and Z' are orthogonal coordinate systems. The X' axis and the Z' axis are slightly inclined with respect to the X axis and Z axis illustrated in FIG. 2 and the like, and among them, the Z' axis extends parallel to the longitudinal direction of the first image forming body part 105a.

The interior of the outer case 105d is partitioned with a board holder 74 so as to be sectioned into a first inner space IR1 facing the inner surface of the first case member 71 and extending along the top surface and the outer surface, a second inner space IR2 extending to a front region in the outer case 105d from a region closer to the bottom surface and the inner surface than the first inner space IR1, and a third inner space IR3 extending to a rear region in the outer case 105d. The first inner space IR1, the second inner space IR2, and the third inner space IR3 correspond to discrete areas formed in the outer case 105d. The two electronic circuit boards 41 and 42 are housed in the first inner space IR1, and the display element 80 and the projection lens 30 are housed in the second inner space IR2. In other words, in the outer case 105d, the electronic circuit boards 41 and 42 and the display element 80 are disposed in discrete areas or rooms separated by the board holder 74, which is a partitioning member.

The outer case 105d includes a first case member 71, which is an upper member, and a second case member 72, which is a lower member. The first case member 71 includes an outer surface member 71b disposed on the side opposite to the wearer, and a top surface member 71a connected to the outer surface member 71b, and the second case member 72 includes an inner surface member 72b disposed on the wearer side, and the bottom surface member 72a connected to the inner surface member 72b. By combining and fixing the first case member 71 and the second case member 72 together, an inner space (specifically, a combination of the inner spaces IR1 to IR3) for housing components such as the display element 80 can be formed. The second case member 72 is disposed on the wearer side, i.e., the +X side, than the first case member 71. Here, whether the position is closer to the wearer side is determined based on the center of gravity of the first case member 71 and second case member 72. The first case member 71 has a function of dissipating the heat generated by the electronic circuit boards 41 and 42 or the first circuit 40a to the outside, and the second case member 72 has a function of dissipating the heat generated by the display element 80 or the second circuit 40b to the outside. The first case member 71 is an integral member including the top surface member 71a that forms the upper surface 105n and the outer surface member 71b that forms the outer surface 105m. The first case member 71 is casted with a magnesium alloy, for example. The second case member 72 is an integral member including the bottom surface member 72a that forms the lower surface 105o, the inner surface member 72b that forms an inner surface 105i, a front plate part 72c that forms the front surface, and a back wall part 72d that forms the appearance of the back part. The second case member 72 is also casted with a magnesium alloy, for example.

In the above configuration, the top surface member 71a and the outer surface member 71b of the first case member 71 are two side surface portions that are coupled at an angle close to a right angle to each other, and the bottom surface member 72a and the inner surface member 72b of the second case member 72 are two side surface portions that are coupled at an angle close to a right angle to each other. The top surface member 71a of the first case member 71, the outer surface member 71b of the first case member 71, the bottom surface member 72a of the second case member 72, and the inner surface member 72b of the second case member 72 are a plurality of side surface portions that surround the columnar outer case 105d, and form a circumferential side surface of the outer case 105d in their entirety. In other words, the outer case 105d has a box shape that surrounds the display element 80, the projection lens 30, the electronic circuit boards 41 and 42, and the like from the top, bottom, inside and outside. The magnesium alloy forming the outer case 105*d* includes aluminum, zinc, and the like in addition to magnesium. By forming the outer case 105*d* with a magnesium alloy, a highly thermal conductive property (e.g., a thermal conductivity of 50 to 200 W/(m·K)) can be achieved while achieving a light weight, and effective heat dissipation of the electronic circuit boards 41 and 42 and the display element 80 through the outer case 105*d* can be achieved. The magnesium alloy specifically used as the material of the outer case 105*d* has a thermal conductivity of approximately 145 W/(m·K).

As illustrated in the region AR2 in FIG. 6, the top surface member 71*a* provided in the first case member 71 and the inner surface member 72*b* provided in the second case member 72 are coupled to each other with a heat insulating structure 76 interposed therebetween in edge regions ED11 and ED21 where they face each other, and the outer surface member 71*b* provided in the first case member 71 and the bottom surface member 72*a* provided in the second case member 72 are coupled to each other with a heat insulating structure 77 interposed therebetween in edge regions ED12 and ED22 where they face each other. Note that, as illustrated in the region AR1 in FIG. 6, the rear end of the first case member 71 and the back wall part 72*d* of the second case member 72 are coupled to each other with a heat insulating structure 78 interposed therebetween in edge regions ED13 and ED23. The front end of the first case member 71 and the front plate part 72*c* of the second case member 72 are coupled to each other with a heat insulating structure 79 interposed therebetween in edge regions ED14 and ED24. In other words, the heat insulating structures 76, 77, 78 and 79 are disposed between the first case member 71 and the second case member 72. More specifically, the first case member 71 and the second case member 72 face each other in their entirety with the heat insulating structures 76, 77, 78 and 79 interposed therebetween, and are thermally separated by the heat insulating structures 76, 77, 78 and 79 from each other. The heat insulating structures 76, 77, 78 and 79 are heat insulating members or air layers. Although the heat insulating structures 76, 77, 78 and 79 are illustrated as elongated members having rectangular cross sections, the cross-sectional shape and the like illustrated in the drawing are merely examples, and various shapes that can be interposed between the case members 71 and 72 may be employed. The edge regions ED11, ED21, ED12, ED22, ED13, ED23, ED14 and ED24 are also not limited to the linear shapes illustrated in the drawing, and may have various shapes, and, in accordance with their shapes, the shapes of the heat insulating structures 76, 77, 78 and 79 are set. Here, the heat insulating member is a member that reduces heat transfer and heat transmission with its material or structure, and exhibits a thermal conductive property (e.g. a thermal conductivity of 0 to 5 W/(m·K)) that is sufficiently lower than the thermal conductive property of the outer case 105*d*. The heat insulating structures 76, 77, 78 and 79 are incorporated in the form of an insulating tape, an insulating sheet, or the like. This increases the ease of incorporation of the heat insulating structures 76, 77, 78 and 79. As the insulating tape or sheet, a resin fiber material type may be used, but this is not a limitation. A composite sheet or an adhesive sheet blended with ceramics may be used, and in the case where these sheets have a structure containing air bubbles, the heat insulating property is further increased. The heat insulating member is formed of, for example, a resin material such as acrylic, polystyrene, fluororesin and phenol resin, a synthetic rubber material, and a ceramic material such as silica and alumina. Specifically, for example, a silica aerogel impregnated in the gap between resin-based fibers may be used. It is not necessary to dispose the heat insulating member as the heat insulating structures 76, 77, 78 and 79 in the entire edge region where the first case member 71 and the second case member 72 face each other, and it is possible to employ a structure in which the heat insulating member and the air layer alternate. However, in the case where the portion where the air layer is interposed is elongated, it is desirable to employ a structure in which recesses and protrusions are combined to make it difficult for water droplets or the like to enter. While the first case member 71 and the second case member 72 are mutually fixed with a fastener such as a screw or an adhesive material, the fastener and the adhesive material need not be an insulating member unless the entire gap between the first case member 71 and the second case member 72 is filled.

The heat insulating structures 76, 77, 78 and 79 are formed of a material having low electrical conductivity such as a material having an electrical resistivity of 104 ω·m or greater, preferably 107 ω·m or greater. In this case, electrical separation between the first case member 71 and the second case member 72 is easily ensured, noise can be prevented from being transmitted at the case members 71 and 72, and transmission of noise from the electronic circuit boards 41 and 42 to the display element 80 is suppressed.

Referring back to FIG. 2, the end portion 10*e* of the light guiding member 10*a* connected to the front end of the projection lens 30 is passed through an insertion opening 70*k* of the outer case 105*d*, and is covered with the first case member 71 and the second case member 72 of the outer case 105*d*. The insertion opening 70*k* of the outer case 105*d* is formed on the front inner side of the outer case 105*d*, and a seal member (not illustrated) is disposed between it and the upper cover 100D or the end portion 10*e* of the light guiding member 10*a*, and thus, the airtightness in the outer case 105*d*, especially in the second inner space IR2, is maintained.

The board holder 74 illustrated in the region AR2 in FIG. 6 and the like is supported by the second case member 72. In other words, the electronic circuit boards 41 and 42 fixed on the board holder 74 is supported by the second case member 72 through the board holder 74. The board holder 74 includes a plate-shaped support part 74*a*, a partition wall part 74*b*, and a frame parts 74*c* and 74*d*. In the outer case 105*d*, the board holder 74 partitions an inner space of the outer case 105*d* so as to form the first inner space IR1 facing the inner surface on the upper side and the outer side of the first case member 71, the second inner space IR2 facing the inner surface of the central portion to the front portion of the second case member 72, and the third inner space IR3 facing the rear portion of the outer case 105*d*. The electronic circuit boards 41 and 42 are supported by the second case member 72 through the board holder 74. More specifically, the electronic circuit board 41 is supported by the plate-shaped support part 74*a* of the board holder 74, and is housed in the first inner space IR1. The electronic circuit board 42 is also supported by the plate-shaped support part 74*a* and housed in the first inner space IR1. In this manner, by using the board holder 74, the arrangement of the electronic circuit boards 41 and 42 in the outer case 105*d* can be freely set. The board holder 74 is a molded product made of a resin material, and has a heat shielding effect compared to the outer case 105*d*. The thermal conductivity of the board holder 74 is approximately 0.1 to 0.4 W/(m·K). Bakelite or the like may be used as the material of the board holder 74. For example, the thermal conductivity of the bakelite is approximately 0.23 W/(m·K), and the thermal conductivity of the rubber is approximately 0.3 W/(m·K). A sheet of a heat insulator 75 that inhibits transfer of the heat from the electronic circuit boards 41 and 42 to the second case member 72 is bonded to a surface of the board holder 74 that faces the second inner space IR2 and/or the third inner space IR3. In other words, the heat insulator 75 is disposed on the display element 80 side of the board holder 74. The thermal conductivity of the heat insulator 75 is approximately 0.015 to 0.05 W/(m·K). As the material of the heat insulator 75, resin fiber materials may be used, but this is not a limitation, and an adhesive sheet or a composite sheet blended with ceramics may be used, and in the case where these sheets have a structure containing air bubbles, the heat insulating property is further increased.

Specifically, a cellulose fibers processed into a sheet shape or a tape shape, a sheet in which silica aerogel is impregnated in a gap between resin fibers, and the like may be used. The board holder 74 plays a role of disposing the electronic circuit boards 41 and 42 separately from the second case member 72 and/or the display element 80 at a position opposite to and close to the inner surface of the first case member 71. The board holder 74 and/or the thermal heat insulator 75 prevents the radiant heat from the electronic circuit boards 41 and 42 from affecting the display element 80 and/or the second case member 72. Thus, by promoting heat dissipation from the electronic circuit boards 41 and 42 to the first case member 71, heat dissipation to the first case member 71 side can be achieved, and temperature rise of the second case member 72 can be suppressed.

Figure 8:
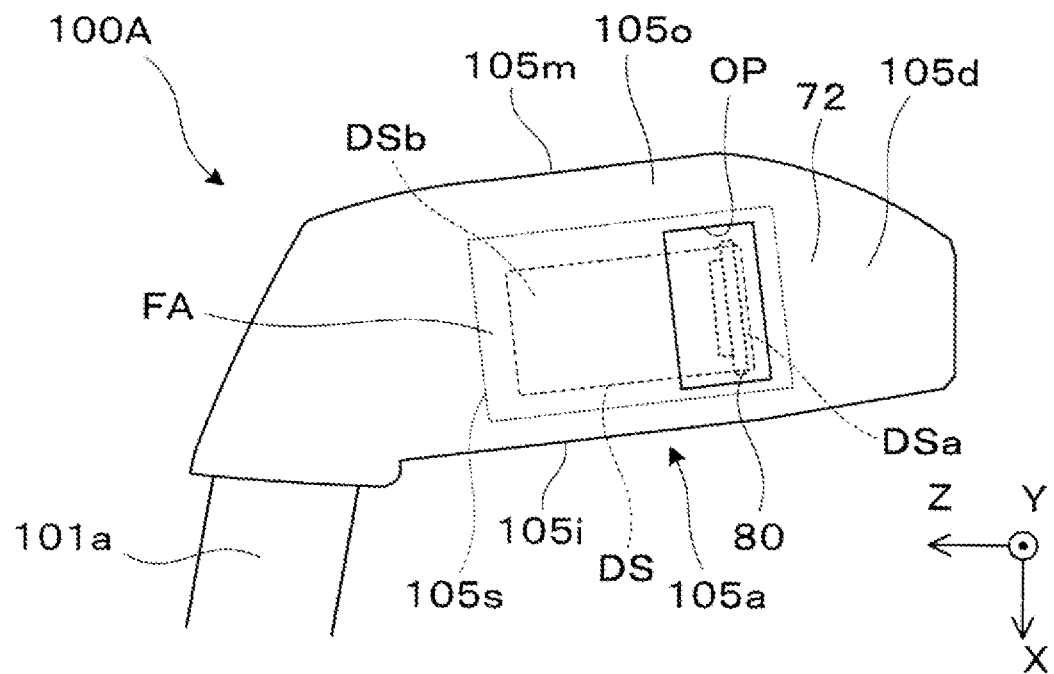
FIG. 8 is a back view illustrating the first image forming body part.

As illustrated in FIG. 6 and FIG. 8, the heat dissipation sheet DS bonded to the back surface of the display element 80 through a thermally conductive adhesive or adhesive material is a heat dissipation member that connects the display element 80 and the second case member 72, and transfers the heat from the display element 80 to the outer case 105d. The heat dissipation sheet (heat dissipation member) DS is fixed to the display element 80 at the first end DSa, and is fixed to the lower surface (side surface) 105o of the outer case 105d at the second end DSb. In other words, the first end DSa of the heat dissipation sheet DS is bonded to the back surface SSr of the display element 80, and the second end DSb of the heat dissipation sheet DS is bonded to the lower surface 105o of the outer case 105d. In this case, the heat dissipation sheet DS is fixed such that it is passed from the display element 80 to the lower surface 105o of the outer case 105d, and thus heat of the display element 80 can be transferred to the lower surface 105o of the outer case 105d along the main surface of the heat dissipation sheet DS. The heat dissipation sheet DS is drawn from the opening OP and extends forward. The second end DSb of the heat dissipation sheet DS is provided with a thermally conductive adhesive or adhesive material attached to the inside, and is two-dimensionally widely bonded to the center portion FA of the lower surface 105o in an intimate manner. The opening OP and the heat dissipation sheet DS are covered and sealed with a waterproof tape 105s. The waterproof tape 105s is a water-impermeable sheet with an adhesive surface on one side, and is intimately bonded and airtightly fixed to the lower surface 105o of the outer case 105d.

The heat dissipation sheet DS is formed of a thermally conductive tape having a high thermal conductive property, and specifically is formed of a graphite sheet. The heat dissipation sheet DS plays a role of efficiently transmitting the heat generated by the display element 80 to the surface of the outer case 105d. The graphite sheet is artificial graphite composed of stacked layers of two-dimensionally crystallized carbon, and has a small thickness and high thermal conductivity (see JP-A-2016-39529). In the case where a graphite sheet is used as the heat dissipation sheet DS, the heat dissipation sheet DS having a small thickness can be disposed with a high degree of bending freedom, and high heat dissipation efficiency can be achieved. The thermal conductivity along the main surface of the graphite sheet may be set to 600 W/(m·K) or greater, and may be set to approximately 1500 W/(m·K), for example.

As illustrated in the region AR1 of FIG. 6 and the like, the cable 109 (see FIG. 1) connected to the electronic circuit board 41 is passed through an opening 71k formed in the back wall part 72d of the second case member 72. The gap between the cable 109 and the opening 71k is easily sealed with a water repellent rubber bushing (not illustrated).

The heat dissipation in the first virtual image forming optical part 101a is described with reference to the region AR2 in FIG. 6. Among the heat sources housed in the outer case 105d, the amount of the heat generated by the display element 80 is smallest, and the amounts of the heat generated by the electronic circuit boards 41 and 42 are substantially equal to each other. In a specific example, for example, the power consumption of the display element 80 is approximately 0.2 to 0.5 W and the amount of generated heat corresponds to the power consumption of 0.2 to 0.5 W. The power consumption of the electronic circuit boards 41 and 42 is approximately 0.5 to 1 W, and the amount of generated heat corresponds to the power consumption of 0.5 to 1 W. The allowable temperature difference of the display element 80 is often approximately $\Delta t=20°$ C., especially when it is composed of an OLED or the like. Heat H1 from the display element 80, which needs to be maintained in a stable state at the lowest temperature, is transmitted to the lower surface 105o of the bottom surface member 72a disposed at the lower end of the outer case 105d through the heat dissipation sheet DS, and spreads to the front plate part 72c, the back wall part 72d, and the like. Thus, the display element 80 can be efficiently cooled. At this time, the heat H1 that has passed through the bottom surface member 72a is easily transmitted to the front plate part 72c, the back wall part 72d, and the like located on the relatively upper side. Heat H2 from the electronic circuit board 41, which generates a relatively larger amount of heat, is transmitted to the outer surface member 71b disposed on the outer side, i.e., the right end, of the outer case 105d mainly as radiant heat and spreads across the first case member 71; however, the heat H2 transmitted to the second case member 72 is limited. Heat H3 from the electronic circuit board 42, which generates a relatively larger amount of heat, is transmitted, mainly as radiant heat, to the top surface member 71a disposed on the upper side of the outer case 105d, and spreads across the first case member 71. Here, the heat H2 from the electronic circuit board 41 and the heat H3 from the electronic circuit board 42 are relatively greater than the heat H1 from the display element 80, and heat the first case member 71 to a relatively high temperature; however, with the board holder 74 and the heat insulator 75, the second case member 72 is thermally isolated and maintained at a relatively low temperature. As a result, the temperature of the inner surface member 72b is significantly lower than the temperature of the outer surface member 71b, and the possibility of giving temperature discomfort to the wearer US can be reliably reduced.

The electronic circuit boards 41 and 42 are disposed relatively away from the inner surface member 72b of the second case member 72. Specifically, the electronic circuit boards 41 and 42 are disposed in the outer case 105d in a region that is relatively away from the inner surface member 72b, i.e., in a region facing the top surface member 71a and the outer surface member 71*b* in a non-inner region DA that is located on the outer side, the upper side, or the lower side. Thus, the entirety or the center of the electronic circuit boards 41 and 42 can be disposed in the vicinity of the top surface member 71*a* and the outer surface member 71*b*, i.e., in the vicinity of the first case member 71, and the heat dissipation efficiency from the electronic circuit boards 41 and 42 to the first case member 71 can be easily increased.

The opening OP through which the heat dissipation sheet DS passes is disposed relatively away from the inner surface member 72*b* of the second case member 72. In other words, in the outer case 105*d*, the opening OP is formed in the bottom surface member 72*a* that faces the non-inner region DA that is relatively away from the inner surface member 72*b*. Thus, the effect of the heat dissipation of the display element 80 is less exerted on the inner surface member 72*b*, and the effect of suppressing temperature rise of the inner surface member 72*b* is produced.

The internal structure and heat dissipation of the first image forming body part 105*a* have been described above. The internal structure and heat dissipation of the second image forming body part 105*b* are the same as those of the first image forming body part 105*a*, and therefore the description thereof is omitted. Note that the second image forming body part 105*b* does not include electronic circuit board 41, and only the electronic circuit board 42 is supported by the board holder 74 in the outer case 105*d*. In this case, the portion facing the outer surface member 71*b* in the plate-shaped support part 74*a* constituting the board holder 74 may be disposed close to the inner surface of the outer surface member 71*b* rather than separating it away from the inner surface of the outer surface member 71*b*.

Figure 9:
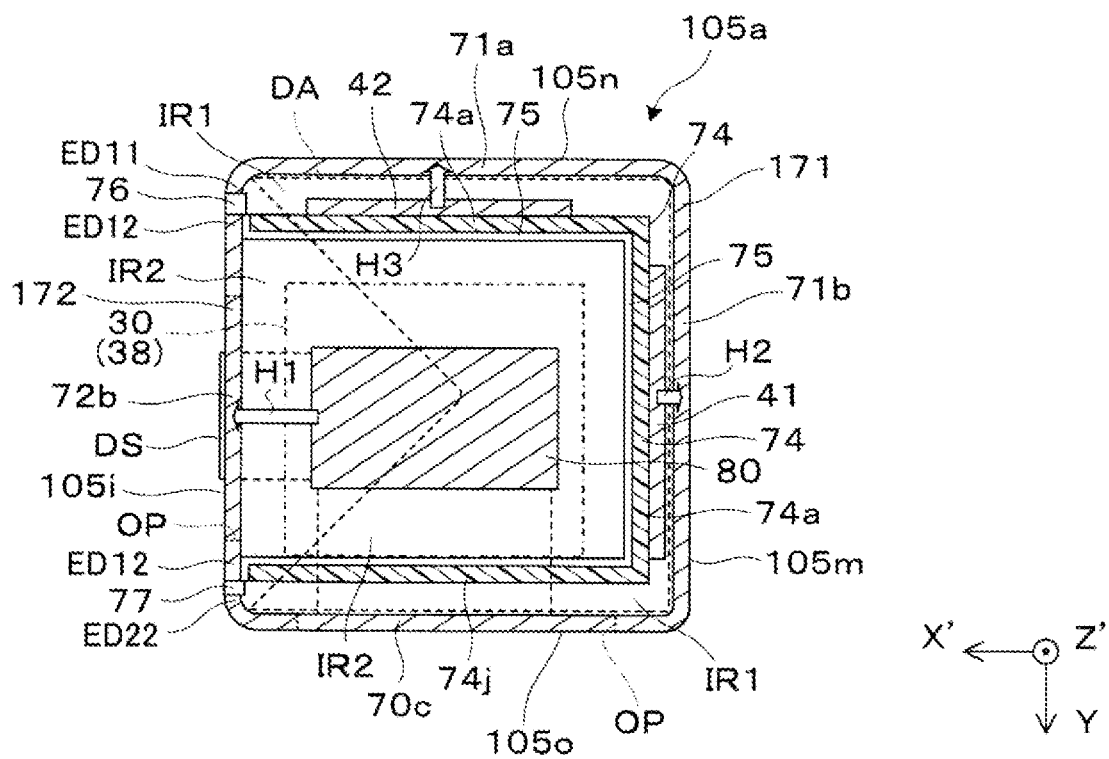
FIG. 9 is a diagram illustrating a modified example of a shape of the outer case.

FIG. 9 is a diagram illustrating a modified example of the outer case 105*d* illustrated in the region AR2 of FIG. 6 and the like. In this case, a first case member 171 includes the outer surface member 71*b* disposed on the side opposite to the wearer, the top surface member 71*a* connected to the upper end of the outer surface member 71*b*, and a bottom surface member 70*c* connected to the lower end of the top surface member 71*a*. In addition, a second case member 172 includes only the inner surface member 72*b*. Further, the plate-shaped support part 74*a* that constitutes the board holder 74 includes a portion 74*j* that is disposed to face the bottom surface member 70*c*. Thus, the second case member 172 has increased thermal isolation or independence with respect to the first case member 171. The heat dissipation sheet DS extending from the display element 80 extends to the inner surface member 72*b* of the second case member 172, and is drawn to the outer surface of the inner surface member 72*b* through the opening OP provided in the inner surface member 72*b* so as to be bonded to the outer surface.

The top surface member 71*a* provided in the first case member 171 and the inner surface member 72*b* provided in the second case member 72 are coupled to each other with the heat insulating structure 76 interposed therebetween in the edge regions ED11 and ED21, and the bottom surface member 70*c* provided in the first case member 171 and the inner surface member 72*b* provided in the second case member 172 are coupled to each other with the heat insulating structure 77 interposed therebetween in the edge regions ED12 and ED22.

As a modified example of the first image forming body part 105*a* illustrated in the region AR2 of FIG. 6 and the like, the electronic circuit board 41 may be disposed outside the first image forming body part 105*a* (e.g., in the external device 200). In this case, the first image forming body part 105*a* and the second image forming body part 105*b* have equivalent circuit configurations.

In addition, the first case member 71 is not limited to an integrated member of the top surface member 71*a* and the outer surface member 71*b*, and the top surface member 71*a* and the outer surface member 71*b* may be formed as separate members with the heat insulating structure interposed therebetween. Likewise, the second case member 72 is not limited to an integrated member of the bottom surface member 72*a* and the inner surface member 72*b*, and the bottom surface member 72*a* and the inner surface member 72*b* may be separate members with a heat insulating structure having a thermal conductivity lower than theirs interposed therebetween.

In the wearable display device 100 of the first embodiment described above, the heat generated by the display element 80 is dissipated to the outside with the second case member 72, and further, the second case member 72 is thermally separated from the first case member 71 by the heat insulating structures 76, 77, 78 and 79. Thus, while ensuring heat dissipation by the second case member 72 of the display element 80, the heat dissipation of the display element 80 by the second case member 72 can be prevented from being inhibited under the influence of the first case member 71, which can have a high temperature under the influence of the electronic circuit boards 41 and 42, for example. As a result, the display element 80 can be kept at a stable low temperature.

Second Embodiment

A wearable display device according to a second embodiment is described below. The wearable display device according the second embodiment is obtained by partially modifying the wearable display device according to the first embodiment, and description of common parts is omitted.

Figure 10:
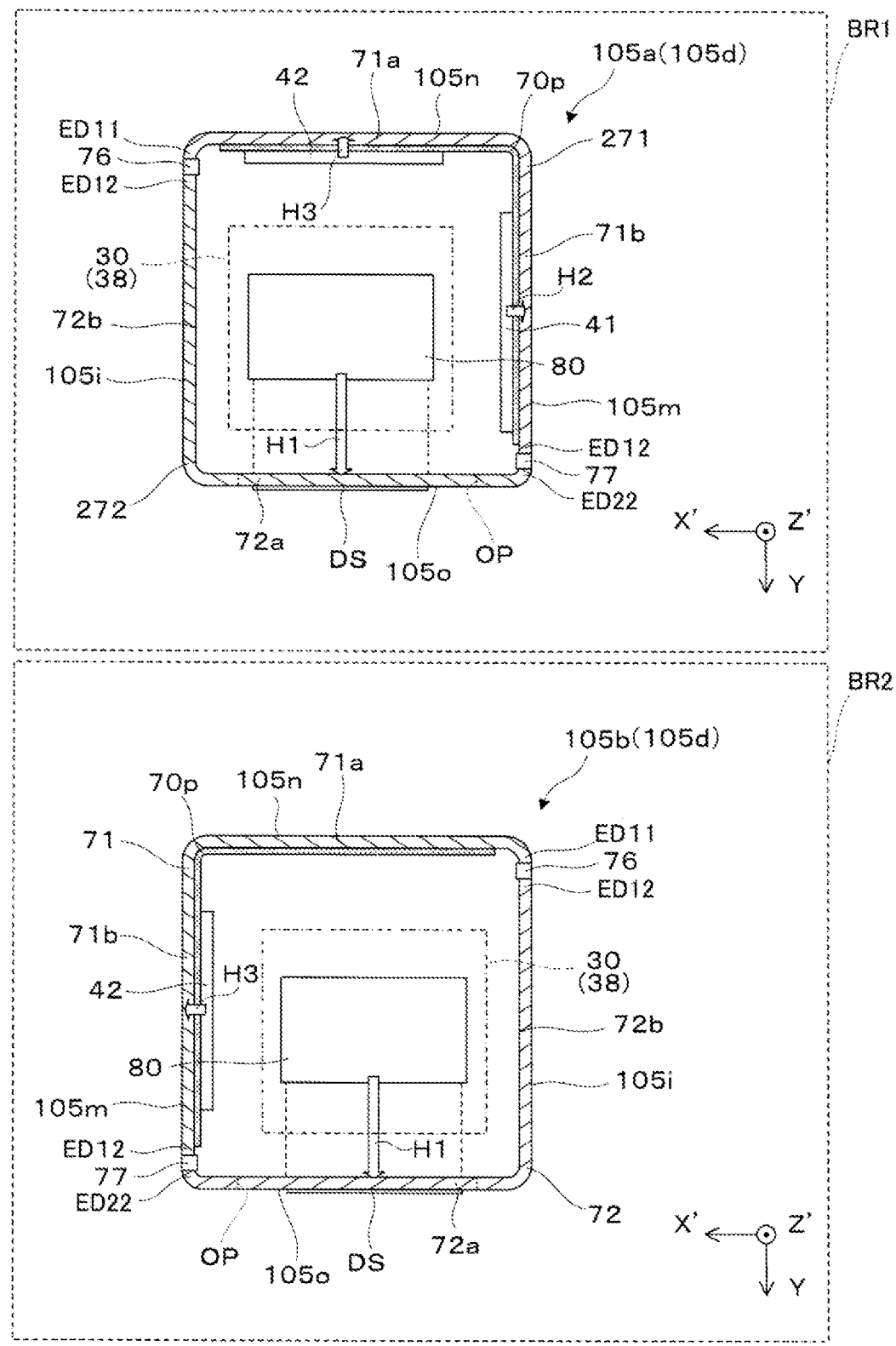
FIG. 10 illustrates a cross-sectional view of a first image forming body part and a cross-sectional view of a second image forming body part of a wearable display device of a second embodiment.

A region BR1 in FIG. 10 illustrates a cross section of the first image forming body part 105*a* of the wearable display device 100 of the second embodiment, and corresponds to the region AR2 of FIG. 6. In this case, in a first case member 271 of the outer case 105*d*, a layered first heat dissipation member 70*p* is bonded to the inner surface thereof, and electronic circuit boards 41 and 42 are bonded to the inside thereof. The first heat dissipation member 70*p* is formed of a thermally conductive material having a high thermal conductive property, and specifically the first heat dissipation member 70*p* is formed of a graphite sheet, for example. As a result, the electronic circuit board 41 is joined to the outer surface member 71*b* through the first heat dissipation member 70*p* and is supported by the outer surface member 71*b*, and the electronic circuit board 42 is joined to the top surface member 71*a* through the first heat dissipation member 70*p*, and is supported by the top surface member 71*a*. The heat dissipation sheet DS extending from the display element 80 is a second heat dissipation member, and extends to the bottom surface member 72*a* of a second case member 272. The heat dissipation sheet DS is drawn to the outer surface of the bottom surface member 72*a* through the opening OP provided in the bottom surface member 72*a* and is bonded to the outer surface.

A region BR2 in FIG. 10 illustrates a cross section of the second image forming body part 105*b*, and the temple or the like of the wearer US presents in the −X' direction. In the second image forming body part 105*b*, only the electronic circuit board 42 is joined to the outer surface member 71*b* through the first heat dissipation member 70*p* and supported by the outer surface member 71b. Note that the electronic circuit board 42 may be supported on the inside of the top surface member 71a.

Figure 11:
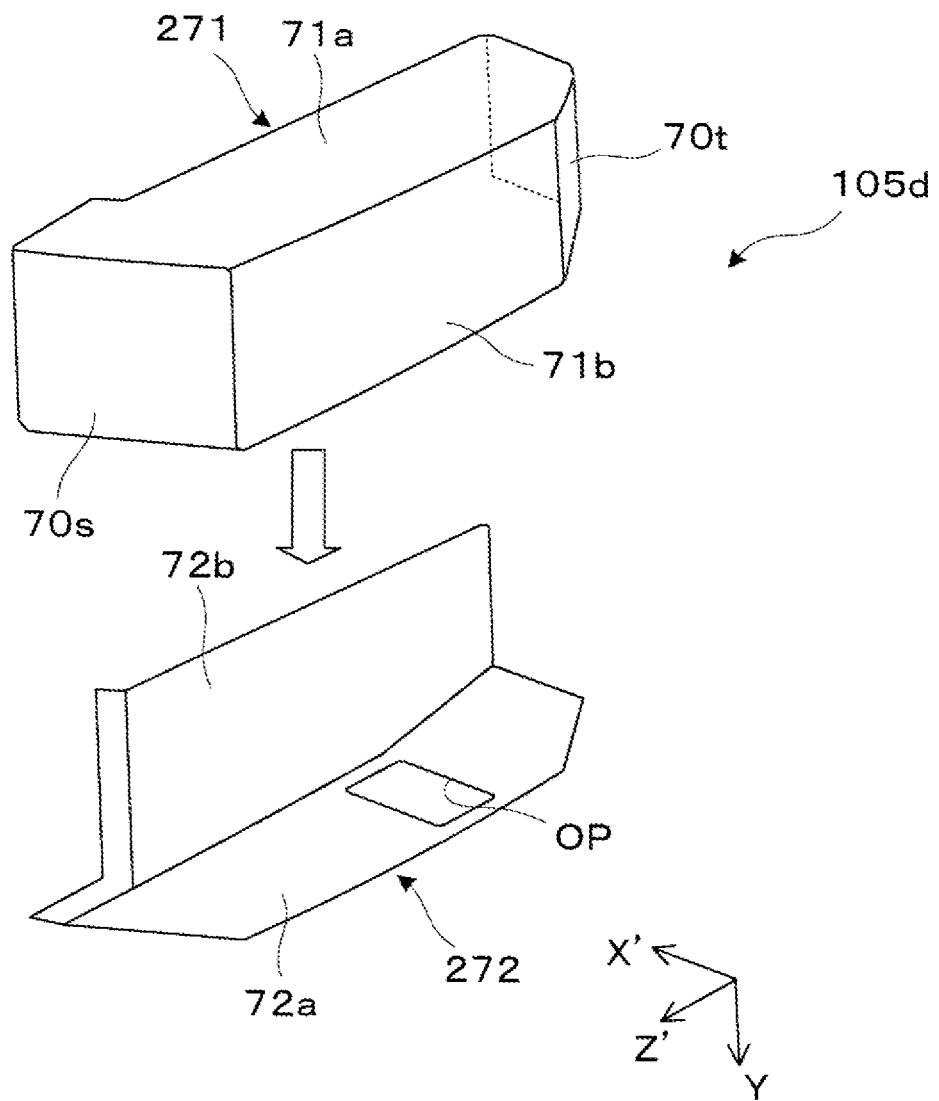
FIG. 11 is a perspective view illustrating a shape of a first case member and a shape of a second case member.

As illustrated in FIG. 11, the first case member 271 includes the top surface member 71a, the outer surface member 71b, a front plate part 70s and a back wall part 70t, and the second case member 272 includes the bottom surface member 72a and the inner surface member 72b. As a result, the area of the first case member 271 is greater than the area of the second case member 272. As a result, the heat dissipation effect by the first case member 271 can be increased, and the cooling efficiency can be increased also for the electronic circuit boards 41 and 42 whose heat dissipation efficiency to the first case member 271 is increased with the first heat dissipation member 70p.

Figure 12:
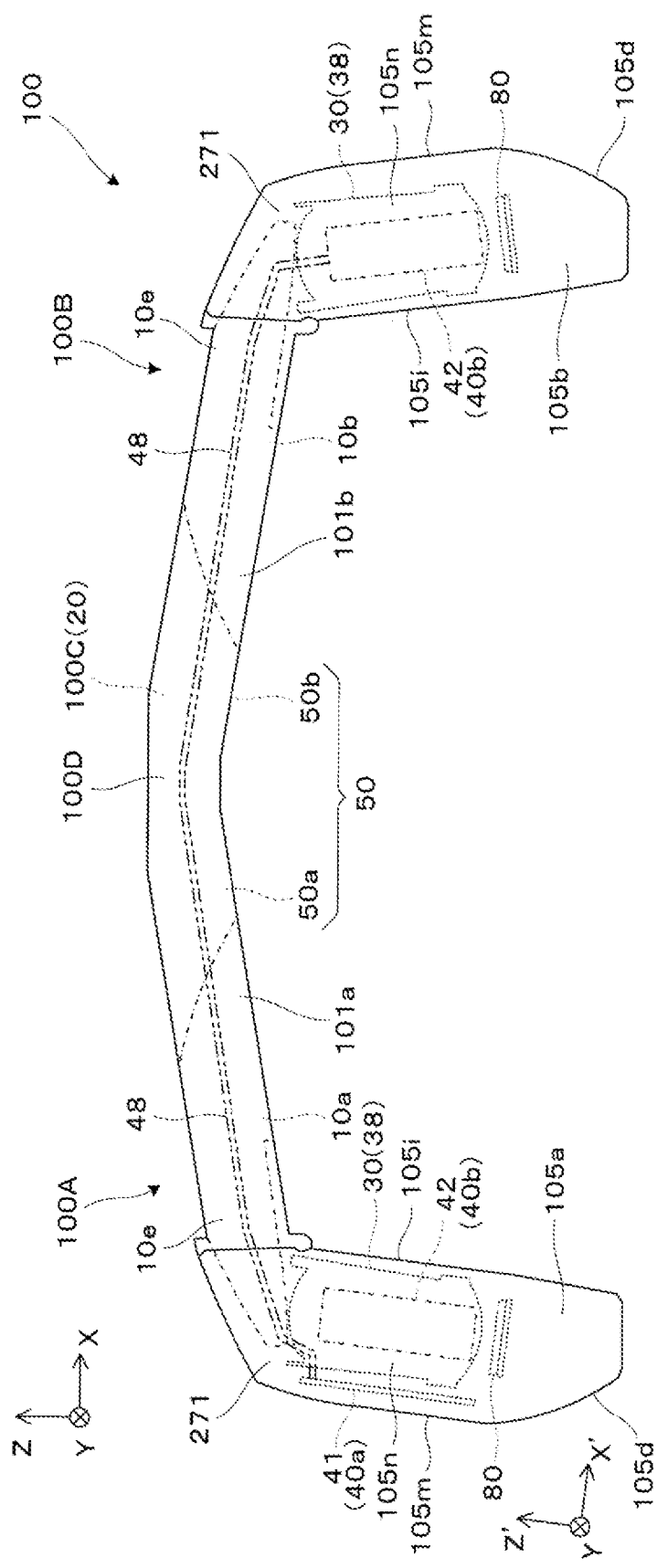
FIG. 12 is a plan view illustrating a modified example of the wearable display device of the second embodiment.

FIG. 12 is a diagram illustrating a modified example of the wearable display device 100 according to the second embodiment. In this case, the outer case 105d of the first image forming body part 105a and the outer case 105d of the second image forming body part 105b are integrated with the upper cover 100D or are joined to the upper cover 100D. The upper cover 100D is a front frame, and is formed of a material having a high thermal conductive property such as a magnesium alloy as with the outer case 105d, for example. The upper cover 100D allows inflow of the heat from the first case member 271 constituting the outer case 105d of the image forming body parts 105a and 105b, and dissipates the heat to the surrounding area. As a result, the heat dissipation efficiency of the outer case 105d can be increased, and the influence of the heat of the electronic circuit boards 41 and 42 on the display element 80 can be suppressed. The upper cover (front frame) 100D extends between the first display device 100A and the second display device 100B and the area can be easily increased, and thus, the cooling efficiency of the first case member 271 and/or the outer case 105d can be increased.

Figure 13:
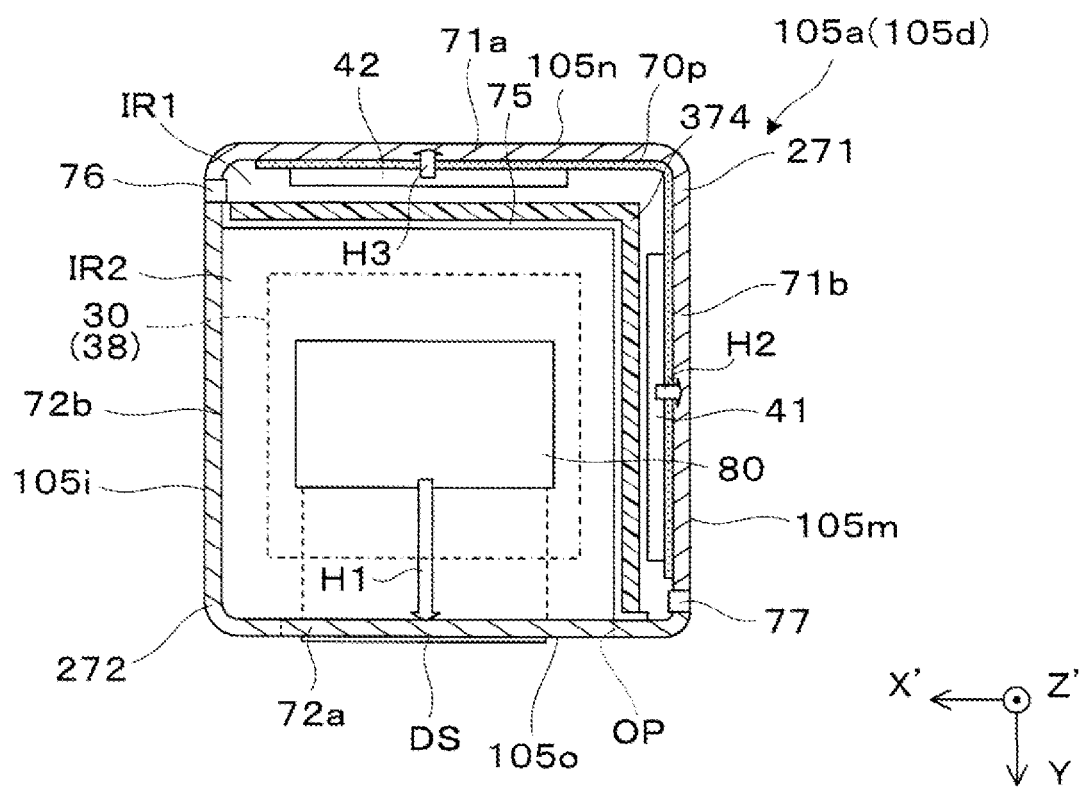
FIG. 13 is a diagram illustrating a modified example of the first image forming body part illustrated in FIG. 10.

FIG. 13 is a diagram illustrating a modified example of the first image forming body part 105a illustrated in the region BR1 of FIG. 10 and the like. In this case, a partitioning member 374 is disposed in the outer case 105d, and the electronic circuit boards 41 and 42 and the display element 80 are separately disposed in the first inner space IR1 and the second inner space IR2, which are discrete areas or rooms separated by the partitioning member 374 in the outer case 105d. The heat insulator 75 is bonded to the entirety of one side of the partitioning member 374 so as to cover the partitioning member 374. As a result, thermal separation between the first case member 271 and the second case member 272 and thermal separation between the electronic circuit boards 41 and 42 and the display element 80 are more complete.

Modified Examples and Other Matters

While the display element 80 is an organic EL display panel or a panel for LCD in the description above, the display element 80 may be a self-luminous display element typified by an LED array, a laser array, a quantum dot light-emitting element, or the like. Further, the display element 80 may be a display using a laser scanner that combines a laser light source and a scanner. Note that the LCD panel may be replaced by liquid crystal on silicon (LCOS) technology.

The outer case 105d is not limited to a magnesium alloy, and may be formed of aluminum or an aluminum alloy.

The outer case 105d may not entirely cover the display element 80 and the electronic circuit boards 41 and 42 that are heating elements, and may partially cover the heating elements. In addition, the outer case may be composed of other boards, cooling fins, and the like.

The function of the electronic circuit board 41 is not limited to the functions described in the embodiments, and various functions may be provided. Specifically, the electronic circuit board 41 may be provided with a power-supply related function, such as a regulator of a charging circuit, for example.

In the case where the heat dissipation sheet DS is a graphite sheet, it is not limited to a single layer, and may be composed of a plurality of graphite sheets. In other words, the heat dissipation sheet DS may be formed by stacking two or more graphite sheets. In this case, it is easy to increase the heat transfer cross section of the heat dissipation sheet DS, and it is easy to increase the cooling efficiency of the display element 80 by reducing the thermal resistance. The heat dissipation sheet DS and the first heat dissipation member 70p are not limited to a graphite sheet, and may be formed of a thermally conductive synthetic resin material typified by a thermally conductive acrylic sheet and a silicon thermal conducting sheet, or, may be formed of a metal based material or a composite thereof.

While the light from the first image forming body part 105a or the second image forming body part 105b is laterally propagated with the light guiding member 10a and guided to the front of the eye in the above description, the light may be guided in the vertical direction. In this case, the first image forming body part 105a or the second image forming body part 105b is disposed on the diagonally upper side or the diagonally lower side of the eye, and the light from the first image forming body part 105a or the second image forming body part 105b is propagated in the vertical direction with the light guiding member and guided to the front of the eye. Here, the image forming body parts 105a and 105b house the display element 80 and the electronic circuit boards 41 and 42 with an outer case having a structure similar to that of the outer case 105d illustrated in FIG. 6 and the like, and thermal interference of the display element 80 and the electronic circuit boards 41 and 42 can be avoided while controlling the heat dissipation and heat flow thereof with the board holder 74, the heat insulator 75, the heat dissipation sheet DS and the like.

While the wearable display device 100 is a binocular head-mounted display (HMD) in the above description, the wearable display device 100 may be a wearable display for a single eye. In this case, the wearable display device 100 is fixed to an eyeglass frame or a dedicated frame, for example, and includes a portion corresponding to the display device 100A and a portion for fixing the portion corresponding to the display device 100A to an eyeglass frame or the like. Here, in the display device 100A, the first virtual image forming optical part 101a is not limited to a part that covers the front of the eye, and may be a part that is disposed in the direction of one corner of the line of sight. Further, the wearable display device 100 may not allow for see-through observation of the outside world image, and may be an optical system that blocks the outside world image and allows for observation of only a virtual image.

A wearable display device according to a first aspect of the present disclosure includes a display element, a circuit board, an outer case including a first case member and a second case member, the first case member being configured to dissipate heat generated by the circuit board to outside, the second case member being disposed farther to a wearer side than the first case member is and configured to dissipate heat generated by the display element to the outside, and a heat insulating structure disposed between the first case member and the second case member.

In the above-described wearable display device, the heat generated by the display element is dissipated to the outside by the second case member, and further, the second case member is thermally separated from the first case member by the heat insulating structure. Thus, while ensuring heat dissipation of the display element by the second case member, the heat dissipation of the display element by the second case member can be prevented from being inhibited under the influence of the first case member, which can have a high temperature under the influence of the circuit board, for example. As a result, the display element can be kept at a stable low temperature.

In a specific aspect, the circuit board includes a signal processing circuit that does not include light emission, and the display element includes a light emitting layer and a drive circuit. In this case, the heat resulting from the signal processing circuit can be dissipated to the outside through the first case member, and the heat resulting from the light emitting layer and the drive circuit can be dissipated to the outside through the second case member.

Another specific aspect includes a heat insulator configured to suppress heat transfer from the circuit board to the second case member, and a heat dissipation member configured to couple the display element and the second case member. In this case, the heat transfer from the circuit board to the first case member can be promoted with the heat insulator, and the heat transfer from the display element to the second case member can be ensured with the heat dissipation members.

In another specific aspect, the circuit board is supported by the second case member through a board holder, and the heat insulator is disposed at a display element side of the board holder. In this case, with the board holder, the circuit board can be disposed separately from the second case member and/or the display element at a position opposite to and close to the inner surface of the first case member.

In another specific aspect, the board holder separates an inside of the outer case into areas discretely, and the circuit board and the display element are disposed in the discrete areas. In this case, the display element is disposed outside the area of the circuit board side, and the effect of suppressing the influence of the generated heat of the circuit board on the display element is increased.

Another specific aspect includes a first heat dissipation member configured to couple the circuit board and the first case member, and a second heat dissipation member configured to couple the display element and the second case member. In this case, heat transfer from the circuit board to the first case member can be ensured with the first heat dissipation member, and heat transfer from the display element to the second case member can be ensured with the second heat dissipation member.

In another specific aspect, the circuit board and the display element are disposed in areas discretely separated by a partitioning member inside the outer case.

In another specific aspect, the first case member includes an outer surface member disposed at an opposite side from a wearer, and a top surface member coupled to the outer surface member, and the second case member includes an inner surface member disposed at the wearer side and a bottom surface member coupled to the inner surface member. In the case where the inner surface member can have a lower temperature than the outer surface member for the reason that the heat generation of the circuit board is greater than the heat generation of the display element, the wearer's feeling of high temperature can be relatively suppressed even if the inner surface member is disposed close to the wearer's face.

In another specific aspect, an area of the first case member is greater than an area of the second case member. In this case, the heat dissipation effect of the first case member can be increased, and the cooling efficiency of the circuit board can be increased.

Another specific aspect includes a light guiding member configured to guide, toward an eye of a wearer, light emitted from the display element. The first case member is coupled to a front frame that covers an end portion of the light guiding member and that extends along the light guiding member at an upper side of the light guiding member. In this case, heat dissipation to the front frame can be achieved, and the temperature of the first case member and the circuit board can be reduced.

Another specific aspect includes a first display device for a left eye and a second display device for a right eye. The first display device includes the display element, the circuit board, the outer case, and the heat insulating structure, the second display device includes, separately from the first display device, the display element, the circuit board, the outer case, and the heat insulating structure, in the first display device, the display element is fixed to the second case member of the outer case, and the circuit board is fixed to the first case member of the outer case, in the second display device, the display element is fixed to the second case member of the outer case, and the circuit board is fixed to the first case member of the outer case, and the first case member of the first display device and the first case member of the second display device are coupled via the front frame. In this case, the front frame extends between the first display device and the second display device and the area can be easily increased, and thus, the cooling efficiency of the first case member can be increased.

A wearable display device according to a second aspect of the present disclosure includes a first circuit, a second circuit, an outer case including a first case member and a second case member, the first case member being configured to dissipate heat generated by the first circuit to outside, the second case member being disposed farther to a wearer side than the first case member is and configured to dissipate heat generated by the second circuit to outside, and a heat insulating structure disposed between the first case member and the second case member.

In the above-described wearable display device, the heat generated in the second circuit is dissipated to the outside with the second case member, and further, the second case member is thermally separated from the first case member by the heat insulating structure. Thus, while ensuring heat dissipation of the second circuit by the second case member, the heat dissipation of the second circuit by the second case member can be prevented from being inhibited under the influence of the first case member, which can have a high temperature under the influence of the first circuit, for example. As a result, the second circuit can be kept at a stable low temperature.

In another specific aspect, the first circuit is a signal processing circuit that does not include light emission, and the second circuit includes a light emitting layer and a drive circuit of a display element. In this case, the display element including the second circuit can be kept at a stable low temperature.

What is claimed is:
1. A wearable display device comprising:
a display element;

a circuit board;
an outer case including a first case member and a second case member, the first case member being configured to dissipate heat generated by the circuit board to outside, the second case member being disposed farther to a wearer side than the first case member is and configured to dissipate heat generated by the display element to the outside;
a heat insulating structure disposed between the first case member and the second case member;
a heat insulator configured to suppress heat transfer from the circuit board to the second case member, wherein the heat insulating structure and the heat insulator are separate members; and
a heat dissipation member configured to couple the display element and the second case member.

2. The wearable display device according to claim 1, wherein
the circuit board includes a signal processing circuit that does not include light emission; and
the display element includes a light emitting layer and a drive circuit.

3. The wearable display device according to claim 1, wherein
the circuit board is supported by the second case member through a board holder; and
the heat insulator is disposed at a display element side of the board holder.

4. The wearable display device according to claim 3, wherein
the board holder separates an inside of the outer case into areas discretely; and
the circuit board and the display element are disposed in the discrete areas.

5. The wearable display device according to claim 1, comprising:
a second heat dissipation member configured to couple the circuit board and the first case member.

6. The wearable display device according to claim 5, wherein the circuit board and the display element are disposed in areas discretely separated by a partitioning member inside the outer case.

7. The wearable display device according to claim 1, wherein
the first case member includes an outer surface member disposed at an opposite side from a wearer, and a top surface member coupled to the outer surface member; and
the second case member includes an inner surface member disposed at the wearer side and a bottom surface member coupled to the inner surface member.

8. The wearable display device according to claim 1, wherein an area of the first case member is greater than an area of the second case member.

9. The wearable display device according to claim 1, comprising a light guiding member configured to guide, toward an eye of a wearer, light emitted from the display element, wherein
the first case member is coupled to a front frame that covers an end portion of the light guiding member and that extends along the light guiding member at an upper side of the light guiding member.

10. The wearable display device according to claim 9, comprising a first display device for a left eye and a second display device for a right eye, wherein
the first display device includes the display element, the circuit board, the outer case, and the heat insulating structure,
the second display device includes, separately from the first display device, the display element, the circuit board, the outer case, and the heat insulating structure,
in the first display device, the display element is fixed to the second case member of the outer case, and the circuit board is fixed to the first case member of the outer case,
in the second display device, the display element is fixed to the second case member of the outer case, and the circuit board is fixed to the first case member of the outer case; and
the first case member of the first display device and the first case member of the second display device are coupled via the front frame.

11. A wearable display device comprising:
a first circuit;
a second circuit;
an outer case including a first case member and a second case member, the first case member being configured to dissipate heat generated by the first circuit to outside, the second case member being disposed farther to a wearer side than the first case member is and configured to dissipate heat generated by the second circuit to outside;
a heat insulating structure disposed between the first case member and the second case member;
a heat insulator configured to suppress heat transfer from the first circuit to the second case member, wherein the heat insulating structure and the heat insulator are separate members; and
a heat dissipation member configured to couple the second circuit and the second case member.

12. The wearable display device according to claim 11, wherein
the first circuit is a signal processing circuit that does not include light emission; and
the second circuit includes a light emitting layer and a drive circuit of a display element.

* * * * *